(12) United States Patent
Raiser et al.

(10) Patent No.: US 6,365,441 B1
(45) Date of Patent: Apr. 2, 2002

(54) PARTIAL UNDERFILL FOR FLIP-CHIP ELECTRONIC PACKAGES

(75) Inventors: George F. Raiser; Bob Sundahl, both of Chandler; Ravi Mahajan, Tempe, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/694,802

(22) Filed: Oct. 23, 2000

Related U.S. Application Data

(62) Division of application No. 09/474,746, filed on Dec. 29, 1999.

(51) Int. Cl.⁷ .......................... H01L 21/44; H01L 21/48; H01L 21/50
(52) U.S. Cl. ....................... 438/127; 438/108; 438/118; 438/126
(58) Field of Search ................................. 438/108, 118, 438/126, 127

(56) References Cited

U.S. PATENT DOCUMENTS

| | | |
|---|---|---|
| 4,322,737 A | 3/1982 | Sliwa, Jr. |
| 5,321,583 A | 6/1994 | McMahon |
| 5,751,556 A | 5/1998 | Butler et al. |
| 5,766,982 A | 6/1998 | Akram et al. |
| 5,804,771 A | 9/1998 | McMahon et al. |
| 5,815,372 A | 9/1998 | Gallas |
| 5,891,753 A | 4/1999 | Akram |
| 5,917,702 A | 6/1999 | Barrow |
| 5,919,329 A | 7/1999 | Banks et al. |
| 5,920,120 A | 7/1999 | Webb et al. |
| 5,936,304 A | 8/1999 | Lii et al. |
| 5,953,814 A | 9/1999 | Sozansky et al. |
| 5,959,362 A | 9/1999 | Yoshino |
| 5,965,937 A | 10/1999 | Chiu et al. |
| 5,973,930 A | 10/1999 | Ikeda et al. |
| 5,981,313 A | 11/1999 | Tanaka |
| 5,990,546 A | 11/1999 | Igarashi et al. |
| 5,991,161 A | 11/1999 | Samaras et al. |
| 5,998,242 A | 12/1999 | Kirkpatrick et al. |
| 6,011,301 A | 1/2000 | Chiu |
| 6,016,006 A | 1/2000 | Kolman et al. |
| 6,049,122 A | 4/2000 | Yoneda |
| 6,093,972 A * | 7/2000 | Carney et al. .............. 257/790 |
| 6,201,301 B1 | 3/2001 | Hoang |
| 6,252,308 B1 | 6/2001 | Akram et al. |

FOREIGN PATENT DOCUMENTS

| | | |
|---|---|---|
| EP | 0340492 A2 | 4/1989 |
| EP | 0778616 A2 | 11/1996 |
| JP | 3-040458 | 2/1991 |

* cited by examiner

*Primary Examiner*—John F. Niebling
*Assistant Examiner*—David A Zarneke
(74) *Attorney, Agent, or Firm*—Blakely, Sokoloff, Taylor & Zafman LLP

(57) ABSTRACT

An integrated circuit package that contains an underfill material between an integrated circuit and a substrate. The integrated circuit may be mounted to the substrate with solder bumps in a C4 process. The underfill material may extend from an edge of the integrated circuit a length that is no less than approximately 25% of the length between the integrated circuit edge and the integrated circuit center. It has been discovered that a length greater than approximately 25% does not provide a significant reduction in the strain of the solder bumps.

18 Claims, 3 Drawing Sheets

PARTIAL UNDERFILL FOR FLIP-CHIP ELECTRONIC PACKAGES

CROSS REFERENCE TO RELATED APPLICATION

This application claims the benefit of and is a divisional of application Ser. No. 09/474,746 filed Dec. 29, 1999.

BACKGROUND OF THE INVENTION

1. Field of the Invention

The present invention relates to an underfill for a C4 integrated circuit package.

2. Background Information

Integrated circuits are typically assembled into packages that are mounted to a printed circuit board. The package may include a substrate that has solder balls or other types of contacts that are attached to the circuit board. An integrated circuit is mounted to the substrate. The substrate typically has routing traces, vias, etc. that electrically connect the integrated circuit to the solder balls.

The integrated circuit may be connected to corresponding surface pads of the substrate with solder bumps in a process commonly referred to as controlled collapsed chip connection (C4). The substrate coefficient of thermal expansion is different than the coefficient of thermal expansion for the integrated circuit. When the package is thermally cycled the difference in thermal expansion may create a mechanical strain in the solder bumps. It has been found that the strain may create cracks and corresponding electrical opens in the solder bumps, particularly after a number of thermal cycles.

Most C4 packages contain an underfill material that is formed between the integrated circuit and the substrate. The underfill material structurally reinforces the solder bumps and improves the life and reliability of the package. The underfill material is typically dispensed onto the substrate in a liquid or semi-liquid form. The liquid underfill then flows between the integrated circuit and the substrate under a capillary action. The liquid underfill is eventually cured into a solid state.

The underfill process completely fills the space between the integrated circuit and the substrate to structurally reinforce all of the solder bumps. A number of techniques have been developed to insure that the underfill material surrounds all of the solder bumps. It is desirable to fill the space between the integrated circuit and the substrate to insure that gases are not trapped within the substrate/integrated circuit interface. The gases may escape during subsequent process steps, particularly if the package is heated and re-flowed onto a motherboard. The release of gases may cause a delamination of the package.

SUMMARY OF THE INVENTION

One embodiment of the present invention is an integrated circuit package that contains an underfill material. The underfill material may extend from an outer edge of the integrated circuit towards the center of the integrated circuit a length $L_1$ that is no less than approximately 25% of a length $L_2$ between the edges and a center of the integrated circuit.

DETAILED DESCRIPTION

Figure 1:
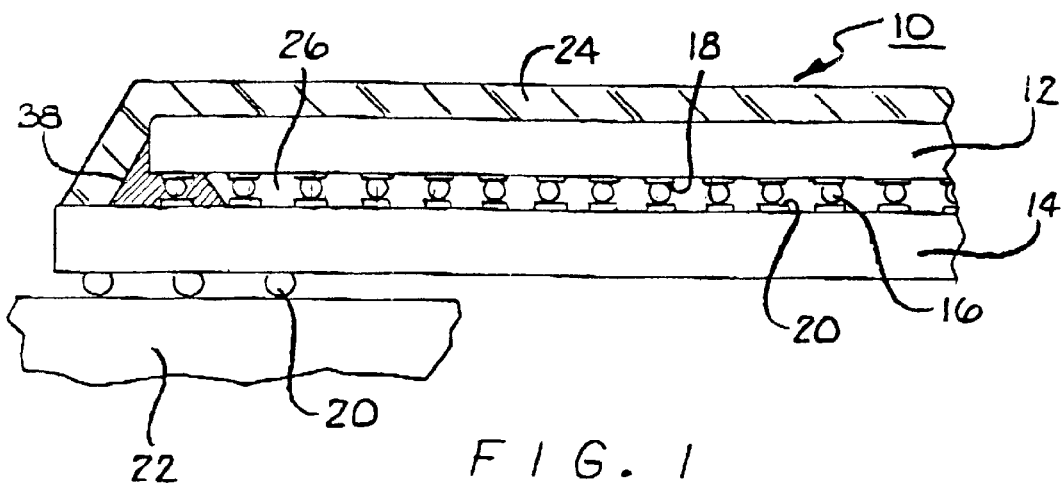
FIG. 1 is a side sectional view of an embodiment of an integrated circuit package of the present invention.
Figure 2:
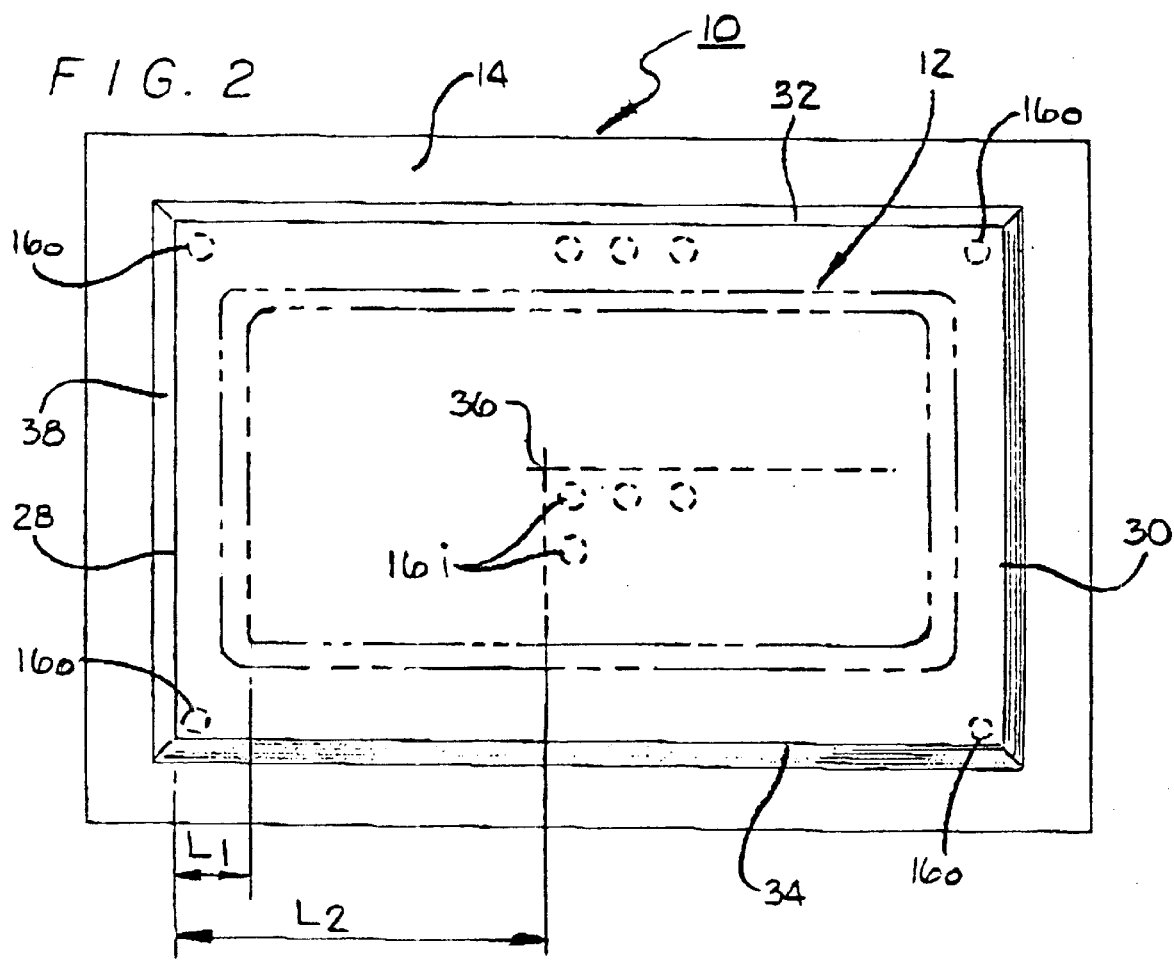
FIG. 2 is a top sectional view of the integrated circuit package.

Referring to the drawings more particularly by reference numbers, FIGS. 1 and 2 show an embodiment of an integrated circuit package 10 of the present invention. The package 10 may include an integrated circuit 12 that is mounted to a package substrate 14. The package 10 may further include a plurality of solder bumps 16 that are connected to die pads 18 of the integrated circuit 12 and corresponding conductive surface pads 20 of the substrate 14. The solder bumps 16 are typically assembled with a process commonly referred to as controlled collapsed chip connection (C4).

The package 10 may include a plurality of solder balls 20 that are attached to the substrate 14. The solder balls 20 may be re-flowed to attach the package 10 to a substrate 22. The package substrate 14 may have routing traces, vias, etc. (not shown) that electrically connect the solder bumps 16 to the solder balls 20. The integrated circuit 12 may be enclosed by an encapsulant or heat spreader 24.

The package 10 may include an underfill material 26 that is located at the interface of the integrated circuit 12 and the substrate 14. The underfill 26 may be an epoxy material that structurally reinforces the solder bumps 16, particularly when the package 10 is thermally cycled.

The integrated circuit 12 may have a first edge 28, a second edge 30, a third edge 32 and a fourth edge 34. The underfill material 26 may extend from the edges of the integrated circuit to a center point 36 of the integrated circuit 12. The underfill material 26 may be assembled into the package 10 so that a fillet 38 is formed along the entire perimeter of the integrated circuit 12. By way of example, the fillet 38 may extend from the substrate 14 to a point approximately one-half the thickness of the integrated circuit 12.

Figure 3A:
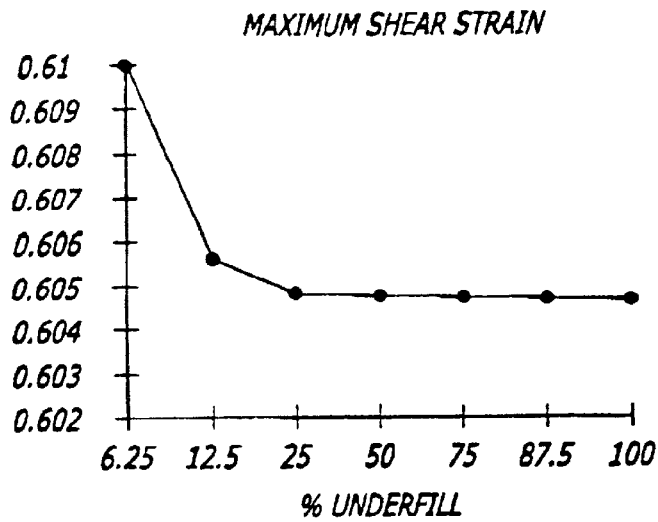
FIG. 3a is a graph showing a shear strain of an outermost solder bump versus an underfill percentage.
Figure 3B:
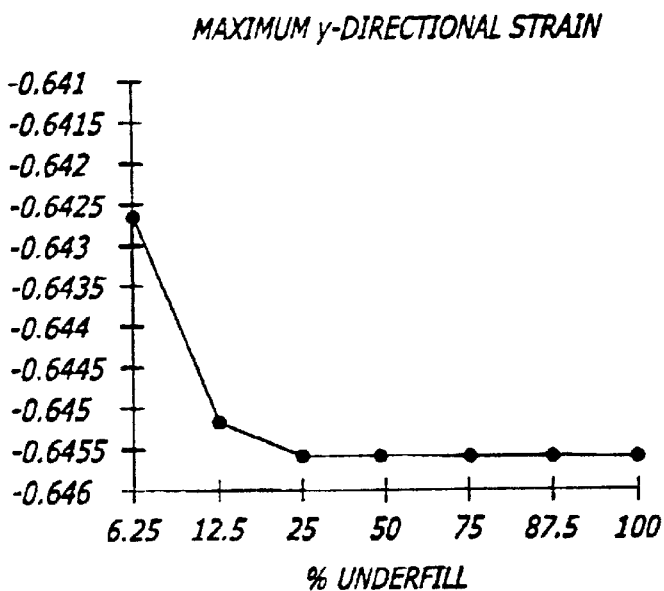
FIG. 3b is a graph showing a y-axis directional strain of the outermost solder bump.
Figure 3C:
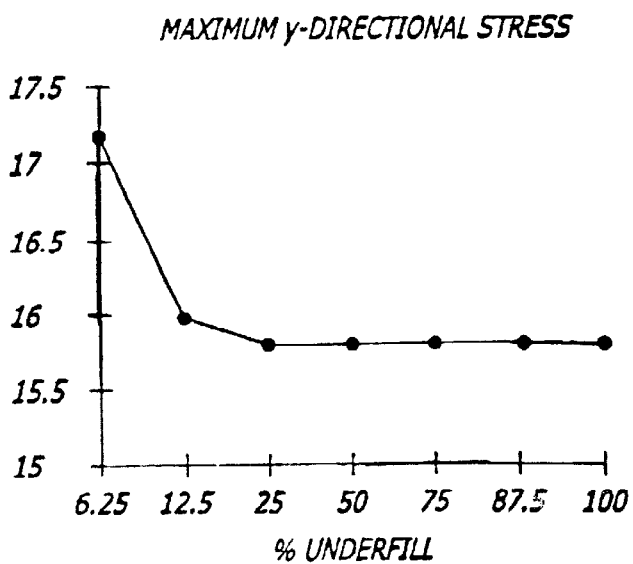
FIG. 3c is a graph showing a y-axis directional stress of the outermost solder bump.

It has been found that the underfill material 26 does not have to completely fill the space between the integrated circuit 12 and the substrate 14 to adequately support the solder bumps 16. FIGS. 3a–c show the shear strain, y-axis directional strain and y-axis directional stress of the solder bumps 16 at the outermost portion of the package versus a percentage of underfill material 26. The outermost solder bumps are identified as 16o in FIG. 2. The percentage of underfill material is defined as the length L1 of the underfill 26 from an edge of the integrated circuit 12 to the non-underfilled area, divided by the length L2 from the edge 28 to the center point 36 of the integrated circuit 12. The graphs are outputs from a finite element program that calculates stress and strains in response to an increase or decrease in temperature. The program was run with the following parameters:

TABLE I

| Material | Young's Modulus (GPa) | Poisson's Ratio (v) | Coeff. of Thermal Exp. (ppm/° C.) | Dimensions |
|---|---|---|---|---|
| Silicon Die (12) | 129.9 | 0.279 | 3.3 | 0.800" wide by 0.027" high |
| BT Substrate (14) | 23.5 | 0.33 | (see text) | 0.906" wide by 0.040" high |
| Dexter 4561 (26) | 6.89 | 0.30 | 26 | Fillet from substrate to half the die thickness. Filled 0.003" -high space between substrate and die and between individual solder balls. |
| 97/3 (Pb/Sn) Solder (16) | 23.5 | 0.35 | 26 | Circular with 0.005" diameter cut top and bottom by the die and substrate. |

The temperature was varied between 23 and 150 degrees centigrade.

As shown in FIGS. 3a–c, the strain and corresponding stress for the outermost solder bumps is not appreciably reduced by increasing the percentage of underfill beyond approximately 25%. It has therefore been discovered that an underfill no less than approximately 25% is required to adequately support the solder bumps 16. At another design criteria, the underfill material may have a minimum coverage of at least two times of adjacent die pads 18.

Figure 4A:
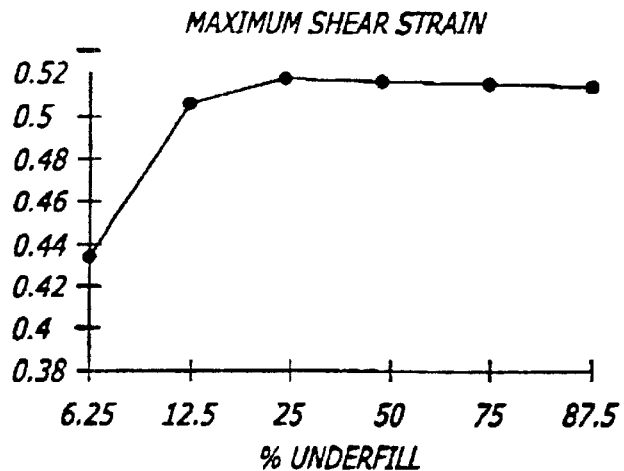
FIG. 4a is a graph showing a shear strain of an outermost unsupported solder bump versus an underfill percentage.
Figure 4B:
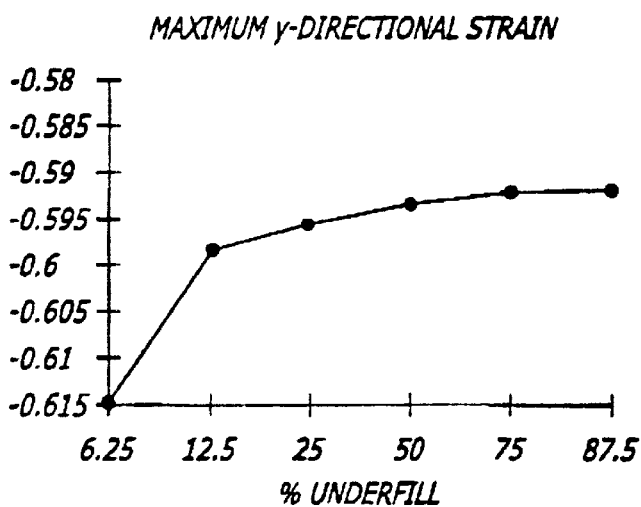
FIG. 4b is a graph showing a y-axis directional strain of the unsupported outermost solder bump.
Figure 4C:
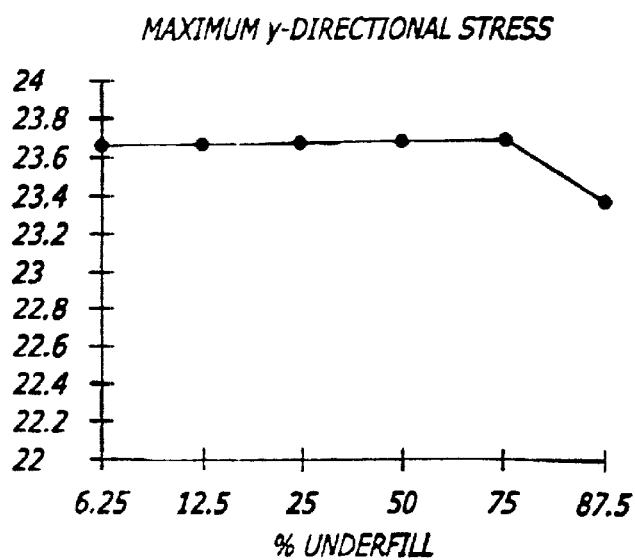
FIG. 4c is a graph showing a y-axis directional stress of the unsupported outermost solder bump.

FIGS. 4a–c show the shear strain, y-axis directional strain and y-axis directional stress for the outermost solder bumps that are not surrounded by underfill material 26. One of these solder bumps is identified as 16i in FIG. 2. It being understood that the outermost solder bumps 16o and the outermost unsupported solder bumps 16i are the bumps that may have the highest strains and stresses. FIGS. 4a–c also show no appreciable decrease in strain and stress for an underfill percentage greater than approximately 25%. It is believed that the fillet 38 along each edge of the integrated circuit 12 provides enough structural integrity for the solder bumps 16. It has been discovered that the underfill material 26 does not have to completely fill the space between the circuit 12 and the substrate 14.

The package 10 can be assembled by initially mounting the integrated circuit 12 to the substrate 14 with a C4 process. Underfill material 26 may then be dispensed along each edge of the integrated circuit 12. The underfill material 26 may be dispensed in a liquid, or semi-liquid form so that the underfill 26 flows between the integrated circuit 12 and the substrate 14 under a capillary action. The volume of underfill material applied may be such that the underfill percentage is not less than approximately 25%. The underfill 26 is cured to a solid state. The solder balls 20 may be attached to the substrate 14 and the integrated circuit 12 may be enclosed with the encapsulant or heat spreader 24 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for assembling an integrated circuit package, comprising:

mounting an integrated circuit to a package substrate, the integrated circuit has four edges;

forming an underfill between the integrated circuit and the package substrate, the underfill extends from the edge of the integrated circuit a length L1 that is no less than approximately 25% of the length L2 between the integrated circuit edge and the integrated circuit center;

forming a fillet material around and beyond said edge of said integrated circuit, wherein said fillet material is of a different material than said underfill; and forming an encapsulant over said integrated circuit and said fillet material, wherein said encapsulant is of a different material than said fillet material.

2. The method of claim 1, wherein the integrated circuit is mounted to the package substrate with a solder bump.

3. The method of claim 11, further comprising the step of attaching a solder ball to the package substrate.

4. A method to assemble an integrated circuit package, the method comprising:

mounting an integrated circuit on a package substrate, the integrated circuit having an edge, a center, and a thickness; and dispensing an underfill material into a gap between the integrated circuit and the package substrate such that the underfill material extends from the edge toward the center of the integrated circuit a length L1 that is no less than approximately 25% of the length L2 between the edge and the center of the integrated circuit; and forming a fillet material around and beyond said edge of said integrated circuit, wherein said fillet material is of a different material than said underfill.

5. The method of claim 4 further comprising:

using a solder bump to mount the integrated circuit to the package substrate.

6. The method of claim 4 wherein the fillet extends from the substrate to a point approximately one-half the thickness of the integrated circuit.

7. The method of claim 4 further comprising:

using a solder ball to mount the package substrate to a printed circuit board.

8. The method of claim 5 wherein the underfill material is an epoxy material that structurally reinforces the solder bump.

9. A method to assemble an integrated circuit package, the method comprising:

mounting an integrated circuit to a package substrate with a controlled collapsed chip connection process, the integrated circuit having four edges and a center; and applying a volume of an underfill material along each edge between the integrated circuit such that the underfill material flows between the integrated circuit and the substrate package in a capillary action; and the volume of underfill material applied is such that an underfill percentage of less than 75% but no less than 25% is achieved; and forming a fillet material around and beyond said edge of said integrated circuit, wherein said fillet material is of a different material than said underfill, wherein said fillet material further extends from said substrate package to approximately one-half the thickness of said integrated circuit.

10. The method of claim 9 wherein the underfill percentage is defined as the length L1 of the underfill from an edge of the integrated circuit to a non-underfilled area, divided by the length L2 from the edge to a center point of the integrated circuit.

11. The method of claim 9 wherein the underfill material may be dispensed in one of a set of a liquid form and a semi-liquid form.

12. A method to assemble an integrated circuit package comprising:

mounting a first group of adjacent die pads to an integrated circuit;

attaching a plurality of solder bumps to the first group of die pads;

mounting a second group of surface pads on a substrate package;

attaching the integrated circuit to the package substrate such that a gap is created between the integrated circuit and the package substrate; and dispensing an underfill material into the gap covering a minimum of at least two times the length of two adjacent die pads;

forming a fillet material around and beyond said edge of said integrated circuit, wherein said fillet material is of a different material than said underfill material; and forming an encapsulant over said integrated circuit and said fillet material, wherein said encapsulant is of a different material than said fillet material and said underfill material.

13. The method of claim 12 further comprising:

dispensing the underfill material along an edge of the integrated circuit.

14. The method of claim 12 wherein the underfill material may be dispensed in one of a set of liquid form and a semi-liquid form so that the underfill material flows between the integrated circuit and the substrate package under a capillary action.

15. The method of claim 12 further comprising:

curing the underfill material to a solid state.

16. A method to assemble an integrated circuit package, the method comprising:

mounting an integrated circuit on a package substrate, the integrated circuit having a perimeter and a center; and dispensing an underfill material into a gap, having a gap volume and the gap being between the integrated circuit and the package substrate such that the underfill material extends from the perimeter toward the center and ranging between less than 100% of the gap volume to no less than 25 of the gap volume to speed and lower cost of assembly while structurally reinforcing the integrated circuit package; and forming a fillet material around and beyond said edge of said integrated circuit, wherein said fillet material is of a different material than said underfill material.

17. The method of claim 16 wherein the underfill material filling the volume ranges between 75% of the gap volume and 25% of the gap volume.

18. The method of claim 16 wherein the underfill material filling the volume ranges between 50% of the gap volume and 25% of the gap volume.

* * * * *